United States Patent [19]
Srinivasan et al.

[11] Patent Number: 5,543,711
[45] Date of Patent: Aug. 6, 1996

[54] MULTIPLE QUADRATURE VOLUME COILS FOR MAGNETIC RESONANCE IMAGING

[75] Inventors: Ravi Srinivasan, Richmond Hts.; Robert A. Elek, Chardon; Haiying Liu, Euclid, all of Ohio

[73] Assignee: Picker International, Inc., Highland Heights, Ohio

[21] Appl. No.: 343,635

[22] Filed: Nov. 22, 1994

[51] Int. Cl.$^6$ .................................................... G01V 3/00
[52] U.S. Cl. .......................................... 324/318; 324/322
[58] Field of Search ...................................... 324/318, 322, 324/313, 314, 307, 309; 128/653.5

[56] References Cited

U.S. PATENT DOCUMENTS

| | | | |
|---|---|---|---|
| 4,692,705 | 9/1987 | Hayes | 324/318 |
| 4,721,913 | 1/1988 | Hyde et al. | 324/318 |
| 4,783,641 | 11/1988 | Hayes et al. | 333/219 |
| 4,799,016 | 1/1989 | Rezvani | 324/318 |
| 4,825,162 | 4/1989 | Roemer et al. | 324/318 |
| 4,918,388 | 4/1990 | Mehdizadeh et al. | 324/322 |
| 4,987,370 | 1/1991 | Leussler et al. | 324/318 |
| 5,196,796 | 3/1993 | Misic et al. | 324/322 |
| 5,198,768 | 3/1993 | Keren | 324/318 |
| 5,216,368 | 6/1993 | Leussler | 324/318 |
| 5,258,717 | 11/1993 | Misic et al. | 324/318 |

OTHER PUBLICATIONS

Patent Application entitled "Multiple Quadrature Surface Coil System For Simultaneous Imaging in Magnetic Resonance Systems", Molyneaux, f. Aug. 11, 1993.
"The NMR Phased Array", Roemer, et al., Academic Press, Inc. 1990. Magnetic Resonance in Medicine 16, 192–225 (1990).
"Weighting Functions for Combination of NMR Images Obtained with Multiple Surface Coils", Reykowski, et al., p. 519 SMRM Aug. 1990 9th Ann. Meeting.
"Modification of an MR Receiver for Simultaneous Image Acquisition From Two Channels", Wright, p. 533 SMRM Aug. 1989 8th Ann. Meeting.
"Improvement of SNR at Low Field Strength Using Mutually Decoupled Coils For Simultaneous NMR Imaging", Leussler, et al., p. 724 SMRM Aug. 1990 9th Annual Meeting.
"Volume Imaging with MR Phased Arrays", Hayes, et al. p. 175 SMRM Aug. 1989 8th Annual Meeting.
"Optimized Birdcage Resonators for Simultaneous MRI of Head and Neck", Leussler, SMRM 1993, p. 1349.
"An Efficient, Highly Homogeneous Radiofrequency Coil for Whole–Body NMR Imaging at 1.5 T", Hayes, et al., pp. 622–628.
"The Theory of the Bird–Cage Resonator", Tropp, Journal of Magnetic Resonance, 82, 51–62 (1989).
"A 64 MHz Half–Birdcage Resonator for Clinical Imaging", Ballon, et al. Journal of Magnetic Resonance 90, 131–140 (1990).
"Head and Neck Vascular Array Coil For MRI", Srinivasan, et al., Society of Magnetic Resonance, 2nd Annual Meeting, San Francisco, CA (1994) p. 1107.

*Primary Examiner*—Louis M. Arana
*Attorney, Agent, or Firm*—Fay, Sharpe, Beall, Fagan, Minnich & McKee

[57] ABSTRACT

A birdcage coil (42) and a quadrature coil pair which are disposed in a partially overlapping but electrically isolated relationship within a static magnetic field generated by a main field magnet (10). The birdcage coil preferably has twelve legs, has eight-fold symmetry, and is tuned to have two linear modes aligned with first and second orthogonal axes. The quadrature coil includes a first or upper coil portion (90) having an even-number of legs and a mode aligned with a third axis. A second or bottom quadrature coil (92) has an odd-number of legs and has a mode which is aligned with a fourth axis, preferably orthogonal to the third axis. Received resonance signals of the two modes of the birdcage coil are combined (66) and digitized (64); resonance signals received in the first and second modes of the quadrature coil pair are combined (66) and digitized (64). The digitized magnetic resonance signals are reconstructed (72) into an image representation, selective portions of which are displayed on a video monitor (52). Biasing voltages (106) are selectively applied to the birdcage and quadrature coils in order to deactivate one of the coils such that only the other coil receives resonance signals.

23 Claims, 4 Drawing Sheets

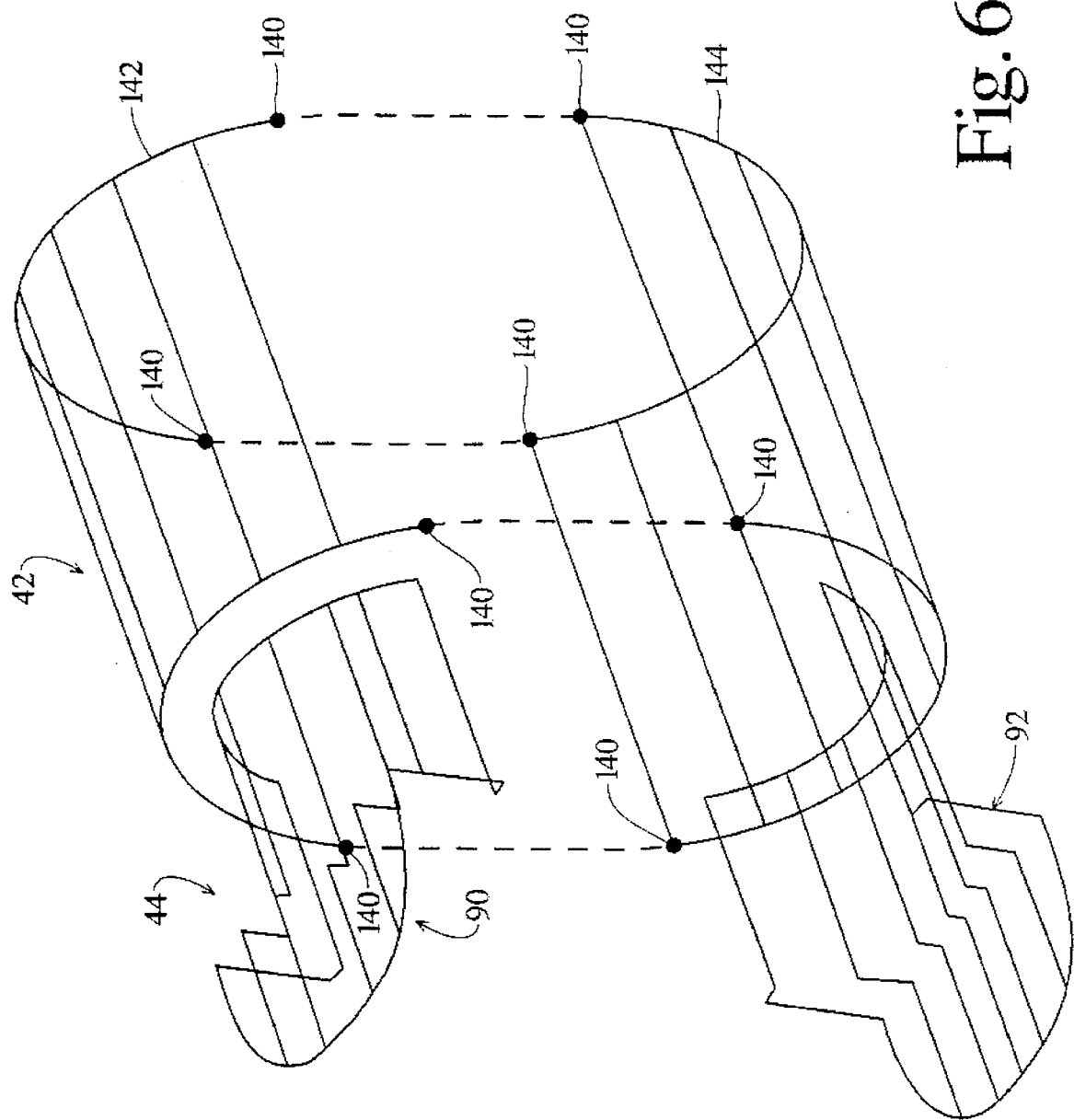

MULTIPLE QUADRATURE VOLUME COILS FOR MAGNETIC RESONANCE IMAGING

BACKGROUND OF THE INVENTION

The present invention relates to the magnetic resonance arts. It finds particular application in conjunction with multiple quadrature volume coils for medical diagnostic applications of magnetic resonance imaging and will be described with particular reference thereto. However, it is to be appreciated, that the present invention will also find application in other multiple coil techniques, spectroscopy, phased array coil techniques, imaging for other than medical diagnostic purposes, and the like.

Conventionally, magnetic resonance imaging systems generate a strong, uniform static magnetic field in a free space or bore of a magnet. This main magnetic field polarizes the nuclear spin system of an object in the bore to be imaged. The polarized object then possess a macroscopic magnetic moment vector pointing in the direction of the main magnetic field. In a superconducting main magnet assembly, annular magnets generate the static magnetic field $B_0$, along a longitudinal or z-axis of the cylindrical bore.

To generate a magnetic resonance signal, the polarized spin system is excited by applying a radio frequency field $B_1$, perpendicular to the z-axis. Typically, a radio frequency coil for generating the radio frequency field is mounted inside the bore surrounding the sample or patient. In a transmission mode, the radio frequency coil is pulsed to tip the magnetization of the polarized sample away from the z-axis. As the magnetization precesses around the z-axis back toward alignment, the precessing magnetic moment generates a magnetic resonance signal which is received by the radio frequency coil in a reception mode.

For imaging, a magnetic field gradient coil is pulsed for spatially encoding the magnetization of the sample. Typically, the gradient magnetic field pulses include gradient pulses pointing in the z-direction but changing in magnitude linearly in the x, y, and z-directions, generally denoted $G_x$, $G_y$, and $G_z$, respectively. The gradient magnetic fields are typically produced by a gradient coil which is located inside the bore of the magnet and outside of the radio frequency coil.

Conventionally, when imaging the torso, a whole body radio frequency coil is used in both transmit and receive modes. By distinction, when imaging the head, neck, shoulders, or an extremity, the whole body coil is often used in the transmission mode to generate the uniform excitation field $B_1$ and a local coil is used in the receive mode. Placing the local coil close to the imaged region improves the signal-to-noise ratio and the resolution. In some procedures, local coils are used for both transmission and reception. One drawback to local coils it that they tended to be relatively small. The whole body coils are typically used for elongated regions, such as the spine. One technique for adapting surface coils for imaging an elongated region is illustrated in U.S. Pat. No. 4,825,162 of Roemer, in which a series of surface coils are lapped to construct a phased array.

Other radio frequency coil designs include a multi-modal coil known as the "birdcage" coil. See, for example, U.S. Pat. No. 4,692,705 of Hayes. Typically, a birdcage coil has a pair of end rings which are bridged by a plurality of straight segments or legs. In a primary mode, currents in the rings and legs are sinusoidally distributed which results in improved homogeneity along the axis of the coil. Homogeneity along the axis perpendicular to the coil axis can be improved to a certain extent by increasing the number of legs in the coil. Typically, a symmetric birdcage coil has eight-fold symmetry. Such a symmetric birdcage coil with N legs exhibits N/2 mode pairs. The first (N/2)-1 mode pairs are degenerate, while the last mode pair is non-degenerate. The primary mode of such an eight-fold symmetric birdcage coil has two linear modes which are orthogonal to each other. The signals from these two orthogonal or quadrature modes, when combined, provide an increased signal-to-noise on the order of 40%. The simplest driven current pattern or standing waves defined by superpositions of degenerate eigenfunctions. For a low-pass birdcage of n meshes driven at is lowest non-zero eigenfrequency, the current in the n-th mesh is given by $\sin(2\pi n/N+\phi)$. The phase angle $\phi$ determines the polarization plane of the resulting $B_1$ radio frequency field and can be varied continuously by suitable application of driving voltages. The alignment and isolation of the two linear modes of a birdcage coil are susceptible to sample geometry. That is, the sample dominates the mode alignment and isolation between the two linear modes.

Birdcage coils, like other magnetic field coils, undergo mutual inductive coupling when positioned adjacent each other. As the coils approach each other, the mutual inductive coupling tends to increase until a "critical overlap" is reached. At the critical overlap, the mutual inductance drops to a minimum. As the coils are moved towards a complete coincidence from the critical overlap, the mutual inductive coupling again increases. See, "Optimized Birdcage Resonators For Simultaneous MRI of the Head and Neck" Leussler Society of Magnetic Resonance in Medicine Abstracts, page 1349, 1993.

Although the critical overlap reduces the mutual coupling between birdcage coils, the mutual coupling is dramatically changed when the sample changes. Introducing a different geometry sample in the two lapped birdcage coils alters the alignment of their modes. The mode isolation in the coils changes, which in turn, affects the symmetry and therefore the mutual coupling between the coils. The greater the mutual coupling, the larger the noise correlation between coils and the lower the combined signal-to-noise ratio. Further, electrical optimization of such lapped birdcage coils is very complex. The isolation process between coils is iterative and time-consuming. That is, the linear modes in each birdcage coil are aligned to their respective coupling points on the coil and isolated with respect to one another, as well as from the two linear modes of the other coil.

The present invention contemplates a new and improved radio frequency coil design which overcomes the above-referenced problems and others.

SUMMARY OF THE INVENTION

In accordance with the present invention, a magnetic resonance system is provided that includes an improved radio frequency coil.

In accordance with one aspect of the present invention, the improved radio frequency coil comprises a birdcage coil in a partially lapped relationship with a quadrature pair coil.

In accordance with a more limited aspect of the present invention, the quadrature pair coil is a distributed inductance-capacitance type quadrature pair.

In accordance with a yet more limited aspect of the present invention, the distributed quadrature pair coil includes a top coil portion and a bottom coil portion. The top and bottom coil portion exhibiting different numbers of resonance modes including modes in each of two orthogonal directions.

In accordance with a yet more limited aspect of the present invention, a primary mode of one of the coils and a secondary mode of the other coil are orthogonal to each other and are tuned to a common frequency to create a quadrature pair.

In accordance with another aspect of the present invention, a method is provided for tuning, matching, aligning, and isolating the birdcage and quadrature pair coils. Prior to overlapping the coils, the two linear modes of the birdcage coil are tuned, matched, and mode isolated from other another. The quadrature pair is also tuned and matched with a similar load. The linear modes of the birdcage and quadrature pair are adjusted to preselected mode orientations. Thereafter, the birdcage and quadrature pair coils are adjustably overlapped until mutual inductance is minimized.

In accordance with another aspect of the present invention, the selected mode orientations of the birdcage and quadrature pair are adjusted relative to each other.

One advantage of the present invention resides in the ease of coil tuning, matching, aligning, and mode orientation adjustments.

Another advantage of the present invention is that it is amenable to single shot tuning after a nominal overlap between the coils is achieved.

Another advantage of the present invention resides in improved patient access and handling. The coil is amenable to a split top design.

Yet another advantage of the present invention is that critical isolation problems are eased, reducing overall complexity of the coil design and construction.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
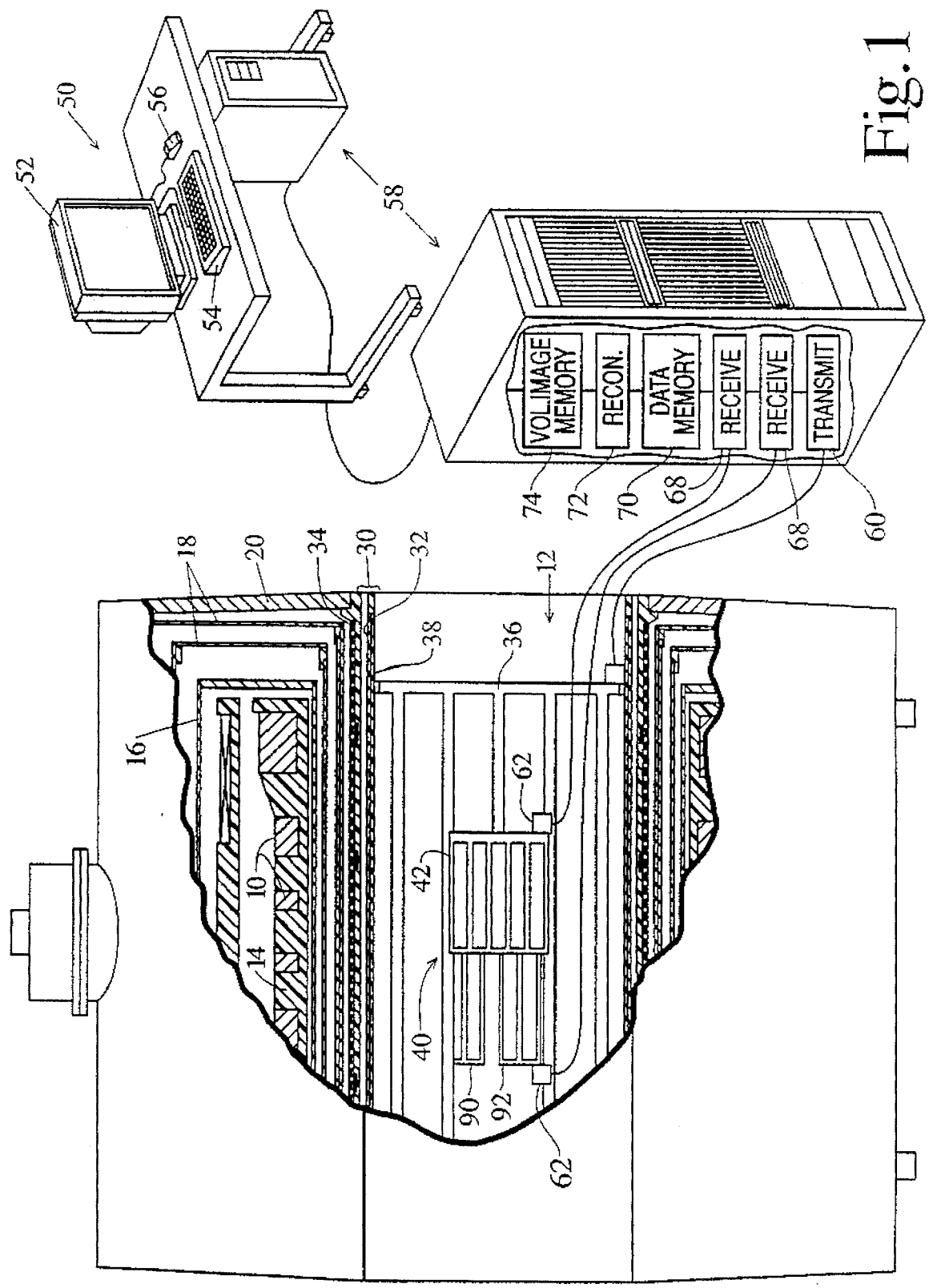
FIG. 1 is a diagrammatic illustration of a magnetic resonance imaging system in accordance with the present invention.

With reference to FIG. 1, a plurality of primary magnetic coils 10 generate a uniform, temporally constant magnetic field $B_0$ along a longitudinal or z-axis of a central bore 12.

In a preferred superconducting embodiment, the primary magnet coils are supported by a former 14 and received in a toroidal helium vessel or can 16. The vessel is filled with helium to maintain the primary magnet coils at superconducting temperatures. The can is surrounded by a series of cold shields 18 which are supported in a vacuum dewar 20. Of course, annular resistive magnets, C-magnets, and the like are also contemplated.

A whole body gradient coil assembly 30 includes x, y, and z-coils mounted along the bore 12 for generating gradient magnetic fields, $G_x$, $G_y$, and $G_z$. Preferably, the gradient coil assembly is a self-shielded gradient coil that includes primary x, y, and z-coil assemblies 32 plotted in a dielectric former and secondary x, y, and z-coil assemblies 34 that are supported on a bore defining cylinder of the vacuum dewar 20. A whole body radio frequency coil 36 is mounted inside the gradient coil assembly 30. A whole body radio frequency shield 38, e.g., copper mesh, is mounted between the whole body RF coil 36 and the gradient coil assembly 30.

An insertable radio frequency coil 40 is removably mounted in the bore in an examination region defined around an isocenter of the magnet 10. In the embodiment of FIG. 1, the local radio frequency coil assembly 40 includes a birdcage style quadrature coil 42 and a partially overlapping quadrature pair coil 44.

An operator interface and control station 50 includes a human-readable display, such as a video monitor 52, and an operator input means including a keyboard 54, a mouse 56, a trackball, light pen, or the like. The computer control and reconstruction module 58 includes hardware and software for enabling the operator to select among a plurality of preprogrammed magnetic resonance sequences that are stored in a sequence control memory. A sequence controller controls gradient amplifiers connected with the gradient coil assembly 30 for causing the generation of the $G_x$, $G_y$, and $G_z$ gradient magnetic fields at appropriate times during the selected gradient sequence and a digital transmitter which causes a selected one of the whole body and insertable radio frequency coils to generate $B_1$ radio frequency field pulses at times appropriate to the selected sequence.

Figures 2, 3A, 3B:
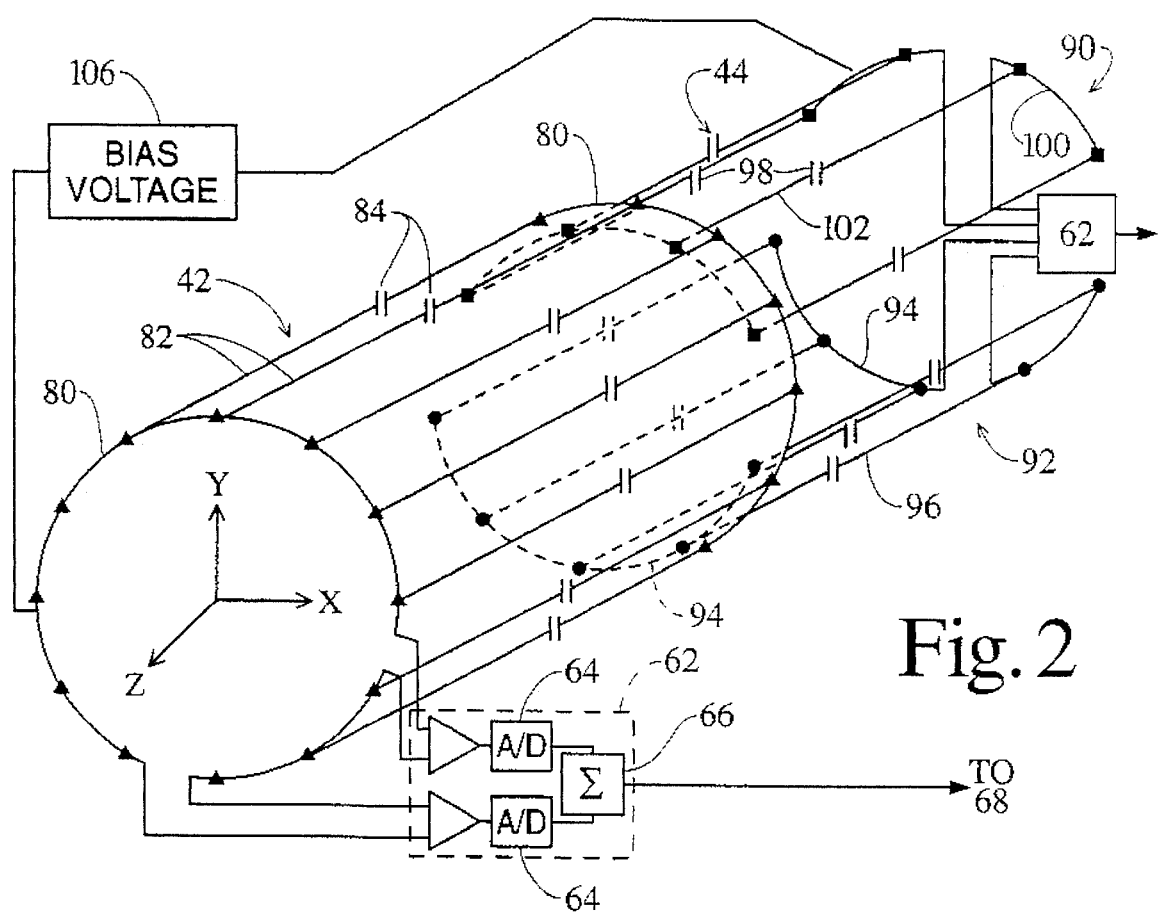
FIG. 2 is a detailed view of an extremity radio frequency coil in accordance with the present invention.
FIGS. 3A and 3B are end views of the birdcage coil and the quadrature pair coil, respectively, of FIG. 2.

With continuing reference to FIG. 1 and further reference to FIG. 2, because the birdcage coil 42 and the quadrature coil pair 44 are both quadrature, each has outputs for two linear modes, preferably orthogonal modes. In the preferred embodiment, the orthogonal modes of each coil are processed by a coil-mounted processing circuit 62 which preamplifies, combines, and digitizes the received radio frequency magnetic resonance signals. More specifically to the preferred embodiment, each of the processing circuits 62 includes a pair of analog-to-digital converters 64 for digitizing each of the two output modes. A digital combiner 66 digitally combines the two modes to produce a digital output signal for each coil which is communicated to a corresponding radio frequency receiver 68 which demodulates the resonance signals. Alternately, the analog resonance signals can be phase shifted by 90° and combined in analog and their sums digitized for conveyance to the receiver. As yet another alternate embodiment, the analog sum can be conveyed directly to the receiver, which receiver demodulates and digitizes the resultant resonance signals. The received resonance signals are stored in a data memory 70. The data from the data memories are reconstructed by a reconstruction or array processor 72 into a volumetric image representation that is stored in an image memory 74. The information from the birdcage and quadrature coils is preferably combined prior to reconstruction. Alternately, the data from the two coils can be separately reconstructed and the volumetric images combined. A video processor under operator control, converts selected portions of the volumetric image representation into slice images, projection images, perspective views, or the like as is conventional in the art for display on the video monitor 52.

With reference again to FIG. 2 and further reference to FIG. 3A, the birdcage coil 42 of the preferred embodiment is eight-fold symmetric. It includes a pair of end rings 80 and N legs 82. A current flowing through the n-th leg varies as $\sin(2\pi n/N+\phi)$, where $\phi$ is the phase angle which determines the polarization plane of the resulting $B_1$ radio frequency field. Tuning capacitances 84 which interrupt the legs are sized such that the coil operates at a selected NMR frequency. Typically, the two modes A,B are adjusted to be orthogonal to each other as shown in FIG. 3A. In the preferred embodiment, the birdcage coil has twelve legs, i.e., N=12.

With continuing reference to FIG. 2 and further reference to FIG. 3B, the quadrature pair 42 includes a pair of coils 90, 92 which have their respective $B_1$ radio frequency fields oriented perpendicular to one another. In the preferred embodiment, the quadrature pair is a distributed inductance-capacitance type quadrature pair. The lower coil 92 has M legs which offers M-1 resonance modes. In the illustrated embodiments, a pair of 150° end arc segments 94 are connected by five legs 96 which are interrupted with capacitors 98. The illustrated semiarcuate construction exhibits a standing wave behavior, although integral half wavelengths. Due to the sinusoidal current distributions, its first two modes are orthogonal to one another and offer homogeneous $B_1$ field distributions for uniform transmission and reception. The top coil 90 has M-1 legs which offers M-2 resonance modes. In the illustrated embodiment, the top coil 90 has a pair of 120° arcuate end segments 100 connected by four legs 102 which are interrupted by capacitors 104. The top coil exhibits three resonance modes, while the bottom coil exhibits four resonance modes.

The primary modes for the quadrature coils are oriented along the y-axis. The second order mode is oriented along the x-axis. In the illustrated pair, the second order mode C of the bottom coil and the first order mode D of the top coil are tuned to the same radio frequency, particularly the resonance frequency of the imaged nuclei to create a quadrature coil pair. Due to their current distributions and individual preference mode orientations, the coils are isolated from one another and their $B_1$ radio frequency fields are orthogonal at the coil center. The $B_1$ radio frequency fields for the above-resonant modes lie much closer to the coil, reducing the amount of noise induced in the sample. Accordingly, these coils provide greater signal-to-noise than a single loop coil of similar dimension. At least one of the birdcage and the quadrature pair are of the low-pass, high-pass, band-pass, or band-stop configuration.

The coils are operable in a transmit and receive mode or in a receive-only mode. In the receive-only mode, the coils are separately operable. A voltage bias circuit 106 under control of the operator terminal 50, applies a bias voltage to one of the volume coils. Applying a bias voltage to the birdcage coil 42 disables it such that only the quadrature pair coil 44 receives resonance signals. Analogously, applying the bias voltage to the quadrature pair coil disables it such that only the birdcage coil receives resonance signals.

Figure 4:
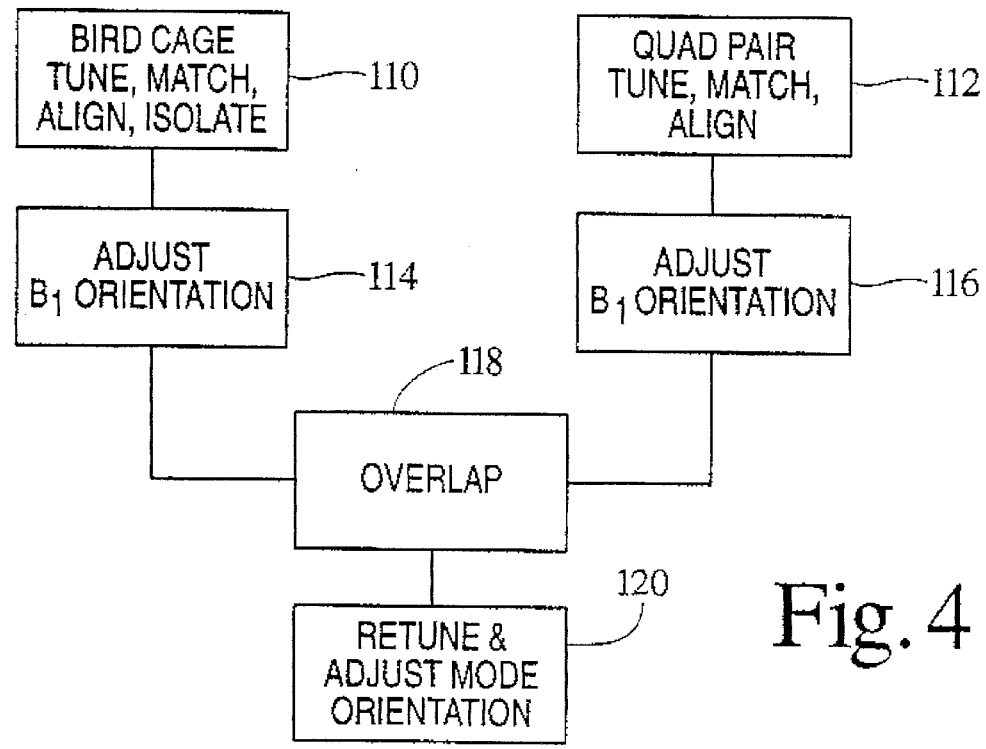
FIG. 4 illustrates a building or a manufacturing procedure.

With reference to FIG. 4, prior to overlapping the birdcage and quadrature pair coils, a step or means 110 tunes, matches, aligns, and isolates the two linear modes of the birdcage coil from one another with a phantom load inside the coil volume. A step or means 112 tunes and matches the quadrature pair with a similar load inside its coil volume. A step means 114 adjusts the orientation of the birdcage coil linear modes A and B to a preselected orientation, e.g., 45° offset from the x and y-axes. Analogously, a step or means 116 adjusts the orientation of the linear $B_1$ field modes C and D of the quadrature pair coil to a selected orientation, e.g., parallel to the x and y-axes. With the coil constructions of the preferred embodiment, the birdcage coil linear modes show no skewing when the coils are overlapped. The alignment of the modes and the isolation between them also remains the same after overlapping. The isolation of the coils of the quadrature pair of the preferred embodiment also remain the same after overlapping. Even a non-symmetric overlap between the quadrature pair coils results in very little change in the birdcage isolation. In an overlapping step 118, the birdcage and quadrature pair coils are overlapped to a point at which there is minimal mutual inductive coupling. Once the coils are overlapped, a step or means 120 checks the resonance frequency and the mode orientations and, if necessary, retunes the coils to the selected resonance frequency and readjusts the relative mode orientations. In this manner, the coils are tuned and aligned in a single pass or iteration. The signal-to-noise ratio of the birdcage and quadrature pair coils remains substantially the same after overlap. The quadrature pair coils are themselves physically separated and isolated from one another, which permits a split top design. That is, the upper coil 90 is preferably detachable such that the subject can be positioned with the examined extremity in the birdcage coil and the lower coil 92. The upper coil is then positioned over the subject. Mechanical supports (not shown) assure that the upper coil is positioned in the same position relative to the lower coil each time it is mounted. Alternately, both the quadrature pair coil and the birdcage coil are of the split design.

For longer regions, an additional birdcage coil can be mounted adjacent an opposite end of the quadrature pair, an additional quadrature pair can be mounted adjacent the additional birdcage coil, etc.

Figure 5:
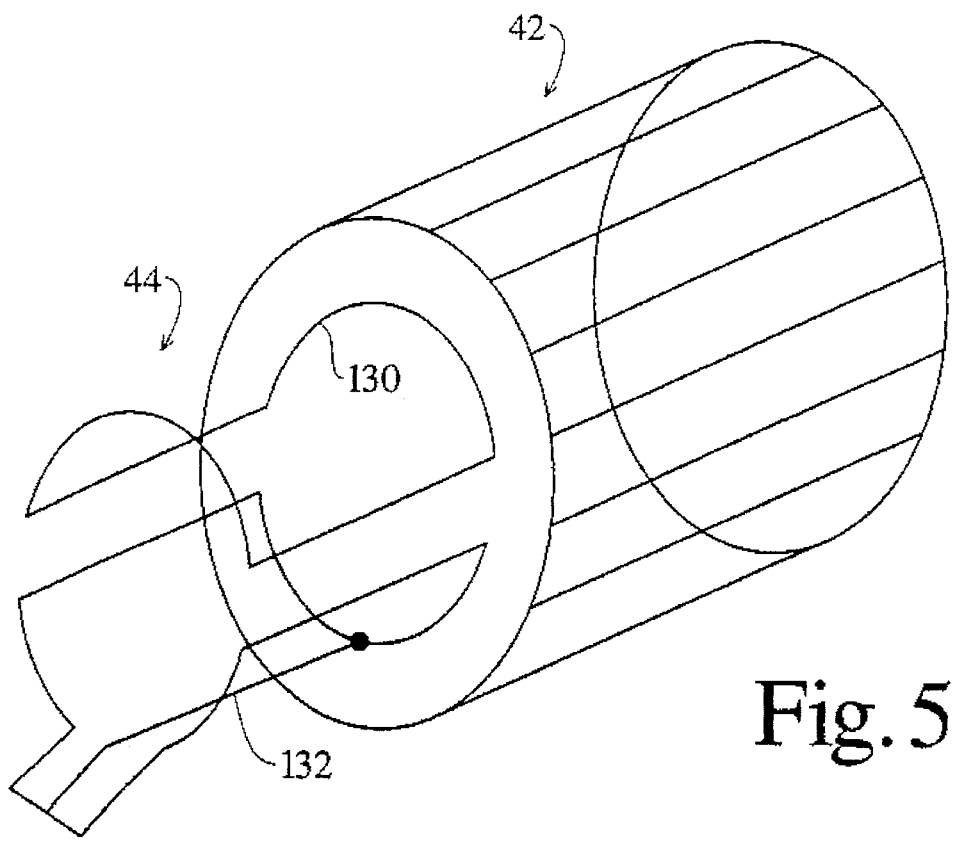
FIG. 5 is a diagrammatic illustration of another radio frequency coil in accordance with the present invention; and, FIG. 6 illustrates a preferred head and spine radio frequency coil in accordance with the present invention.

Various alternate embodiments are of course, immediately apparent. For example, with reference to FIG. 5, the quadrature pair 44 can be a quadrature pair with two-fold symmetry, such as a loop coil 130 and a double D or Helmholtz coil 132. Alternately, two loop or two Helmholtz coils can define the quadrature pair. Preferably, the birdcage head coil and the lower quadrature coil, which images a posterior part of the neck, are connected with a patient support system. An anterior part of the neck coil is removably fastened to the mechanical support system once the patient is positioned on the patient table. The head coil then slides forward to a preset position on the patient support system. This insures quick positioning before starting a magnetic resonance study.

With reference to FIG. 6, the birdcage coil 42 is configured with appropriate geometry to receive the patient's head. The quadrature pair coil 44 is configured to receive the patient's neck and upper chest. The birdcage coil has four sets of connectors or connection points 140 to enable it to be opened to receive the patient's head and closed for imaging. The upper quadrature coil 90 and an upper portion 142 of the birdcage coil are connected to a common support structure (not shown) to be removed and replaced as a unit. The lower quadrature coil 92 and a lower birdcage coil portion are connected with a common support structure (not shown). The upper and lower quadrature coils are distributed coils.

In another alternate embodiment, the birdcage coil may have less than eight-fold symmetry and the quadrature pair coils may have as little as no-fold symmetry. The birdcage coil, although illustrated as cylindrical, may be elliptical or other geometric shapes contoured to the human anatomy. Various quadrature pairs may be utilized, such as loop type, planar pair type, Helmholtz type, Figure-8 type, distributed inductance-capacitance type, or a combination thereof. The quadrature pair coils may be square, rectangular, circular, elliptical, or the like and be mounted on a cube, cylinder, a curved surface geometry, or the like, in order to accommodate the anatomy under investigation.

As yet another alternative, the birdcage coil can be tuned to more than one resonance frequency as can the quadrature pair. Analogously, the birdcage coil and quadrature pair can be tuned to different resonance frequencies.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance apparatus which includes a magnet for generating a temporally constant, uniform magnetic field through an examination region, a radio frequency coil which performs at least one of (1) transmitting radio frequency signals into the examination region to induce and manipulate magnetic resonance of dipoles disposed in the examination region, and (2) for receiving radio frequency signals from the dipoles disposed in the examination region, and a processor for processing the received magnetic resonance signals, the improvement comprising:

the radio frequency coil including a first quadrature volume radio frequency coil and a second quadrature volume radio frequency coil disposed only partially overlapping and electrically isolated from each other such that a radio frequency current distribution in one of the quadrature volume coils is independent of a radio frequency current distribution in the other quadrature volume coil such that the first and second quadrature volume radio frequency coils maintain preferred mode orientations.

2. In a magnetic resonance system which includes a magnet for generating a temporally constant, uniform magnetic field through an examination region, a radio frequency coil which performs at least one of (1) transmitting radio frequency signals into the examination region to induce and manipulate magnetic resonance of dipoles disposed in the examination region, and (2) for receiving radio frequency signals from the dipoles disposed in the examination region, and a processor for processing the received magnetic resonance signals, the improvement comprising:

the radio frequency coil including a birdcage coil and a quadrature pair disposed partially overlapping and electrically isolated from each other such that radio frequency current distributions in the birdcage coil and the quadrature pair are independent of each other such that the birdcage coil and the quadrature pair each maintain a preferred mode orientation.

3. In the magnetic resonance apparatus of claim 2, the improvement further comprising:

the quadrature pair volume coils including a distributed inductance-capacitance type quadrature pair, the distributed inductance-capacitance type quadrature pair including first and second coils which are electrically isolated such that each carries a radio frequency current distribution which is independent of the other.

4. In the magnetic resonance apparatus of claim 2, the improvement further comprising:

at least one additional quadrature radio frequency coil disposed in a partially overlapping arrangement with one of the birdcage and quadrature pair coils.

5. A magnetic resonance system comprising:

a main magnet assembly which generates a uniform, temporally constant magnetic field through an examination region;

a birdcage radio frequency coil disposed around a portion of a subject in the examination region for at least receiving radio frequency signals from resonating dipoles of the subject, the birdcage coil having first and second linear modes tuned to a resonant frequency of the resonating dipoles, the two linear modes being aligned along first and second orthogonal axes, respectively;

a quadrature pair radio frequency coil disposed around a second portion of the subject in the examination region adjacent the first subject portion for receiving resonance signals from resonating dipoles in the second subject portion, the quadrature pair radio frequency coil including a first coil having a first mode aligned with a third axis and a second coil having a mode aligned with a fourth axis, the fourth axis being perpendicular to the third axis such that the first and second coils define a quadrature relationship; and, a processor for processing magnetic resonance signals from the birdcage and quadrature pair coils into diagnostic information.

6. The magnetic resonance system as set forth in claim 5, further including:

a first preamplifier for amplifying first mode signals from the birdcage coil;

a second preamplifier for amplifying second mode signals from the birdcage coil;

a first signal combiner for combining the first and second mode signals from the first and second preamplifiers, the first signal combiner being connected with the reconstruction processor for conveying the combined signals thereto;

a third preamplifier for amplifying magnetic resonance signals from the first quadrature pair coil;

a fourth preamplifier for amplifying magnetic resonance signals from the second quadrature pair coil; and, a second signal combiner for combining magnetic resonance signals from the third and fourth preamplifiers and conveying the combined quadrature coil magnetic resonance signals to the reconstruction processor.

7. The magnetic resonance system as set forth in claim 6, further including at least a first analog-to-digital converter for converting at least one of (1) the first and second mode magnetic resonance signals of the birdcage coil, and (2) the combined magnetic resonance signals of the birdcage coil from analog-to-digital format; and, at least a second analog-to-digital converter for converting at least one of (1) the first quadrature pair coil magnetic resonance signal and the second quadrature pair coil magnetic resonance signal, and (2) the combined quadrature pair coil signal from analog-to-digital format.

8. The magnetic resonance system as set forth in claim 7 wherein the first combiner and the first analog-to-digital converter are mounted on the birdcage coil and wherein the second combiner and the second analog-to-digital converter are mounted on the quadrature coil pair.

9. The magnetic resonance system as set forth in claim 5, further including:
   a gradient coil assembly disposed around the examination region for selectively generating magnetic field gradients along three mutually orthogonal axes; and,
   wherein the processor includes a reconstruction processor for reconstructing the magnetic resonance signals from the birdcage and quadrature pair coils into a volumetric image representation.

10. The magnetic resonance system as set forth in claim 5 further including a biasing voltage means for selectively applying biasing voltages to the birdcage and quadrature pair coils in order to deactivate one of the birdcage and quadrature coils such that only the other coil receives magnetic resonance signals.

11. The magnetic resonance system as set forth in claim 5 wherein the birdcage coil and the quadrature pair coils are disposed in a physically lapped orientation, but electrically isolated such that current distributions in the birdcage coil and the first and second quadrature pair coils are independent of each other.

12. The magnetic resonance system as set forth in claim 11 wherein the quadrature coil pair first coil includes a pair of arcuate segments interconnected with an odd number of legs and the second quadrature coil includes a second pair of arcuate segments interconnected with an even number of legs.

13. The magnetic resonance system as set forth in claim 11 wherein an upper coil of the quadrature coil pair is selectively removable to facilitate patient access.

14. The magnetic resonance system as set forth in claim 13 wherein the birdcage coil is a split coil such that an upper portion of the birdcage coil is selectively removable.

15. The magnetic resonance system as set forth in claim 11 wherein the quadrature pair coil includes:
   an upper distributed coil; and
   a lower distributed coil.

16. A magnetic resonance method comprising:
   generating a static magnetic field through an examination region;
   inducing magnetic resonance of selected dipoles of a subject within the examination region to generate a magnetic resonance signal;
   receiving a first portion of the magnetic resonance signal with a first volume coil and a second portion of the magnetic resonance signal with a second volume quadrature coil, which first and second volume coils are electrically isolated from each other.

17. The method as set forth in claim 16 further including reconstructing the received resonance into a volumetric image representation.

18. The method as set forth in claim 16 wherein the first quadrature coil has modes along first and second orthogonal axes and the second quadrature coil has modes aligned with third and fourth orthogonal axes and further including selectively adjusting an angular orientation of the first and second axes relative to the third and fourth axes.

19. The method as set forth in claim 16 further including:
   tuning and matching the first and second volume coils independently;
   adjusting the relative orientation of axes along which the first volume coil has aligned modes;
   adjusting the relative orientation of axes along which the second volume coil has aligned modes;
   moving the first and second coils into a partially overlapping configuration while maintaining the first and second coils electrically isolated such that the first and second coils carry radio frequency current distributions which are independent of each other.

20. The method as set forth in claim 19 further including:
   adjusting the mode alignment axis of the first volume coil to be orthogonal to each other;
   adjusting the mode alignment axes of the second volume coil to be orthogonal to each other;
   adjusting the mode alignment axes of the first volume coil to be offset by 45° relative to the mode alignment axes of the second volume.

21. The method as set forth in claim 16 further including applying a biasing voltage to the first volume coil to deactivate it such that only the second volume coil receives magnetic resonance signals.

22. The method as set forth in claim 16 wherein the first volume coil is a birdcage coil.

23. A method of magnetic resonance imaging comprising:
   generating a temporally constant magnetic field through an examination region;
   disposing a patient in a radio frequency coil assembly which includes a birdcage coil and a quadrature volume coil which partially overlap each other, the overlap between the birdcage coil and the quadrature volume coil being adjusted to optimize electrical isolation from each other;
   selectively causing magnetic field gradients across the examination region;
   transmitting radio frequency signals into the examination region to induce and manipulate magnetic resonance of dipoles disposed in the examination region;
   radio frequency resonance signals from dipoles disposed in the examination region inducing radio frequency current distributions in the birdcage coil and the quadrature volume coil, which current distributions are independent of each other such that the birdcage coil and the quadrature volume coil each maintain a preferred mode orientation;
   converting the radio frequency current distributions into digital electronic signals; and
   reconstructing the digital electronic signals into magnetic resonance image representations.

* * * * *